(12) United States Patent
Takeuchi

(10) Patent No.: US 12,289,096 B2
(45) Date of Patent: Apr. 29, 2025

(54) ACOUSTIC WAVE FILTER DEVICE

(71) Applicant: Murata Manufacturing Co., Ltd., Nagaokakyo (JP)

(72) Inventor: Yuta Takeuchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 499 days.

(21) Appl. No.: 17/592,584

(22) Filed: Feb. 4, 2022

(65) Prior Publication Data
US 2022/0158623 A1  May 19, 2022

Related U.S. Application Data

(63) Continuation of application No. PCT/JP2020/027908, filed on Jul. 17, 2020.

(30) Foreign Application Priority Data

Aug. 6, 2019 (JP) .................. 2019-144407

(51) Int. Cl.
H03H 9/56 (2006.01)
H03H 9/13 (2006.01)
H03H 9/17 (2006.01)

(52) U.S. Cl.
CPC .............. H03H 9/568 (2013.01); H03H 9/13 (2013.01); H03H 9/17 (2013.01)

(58) Field of Classification Search
CPC ............ H03H 9/568; H03H 9/13; H03H 9/17; H03H 9/6483; H03H 9/02574
See application file for complete search history.

(56) References Cited

U.S. PATENT DOCUMENTS

2004/0227587 A1  11/2004 Inoue et al.
2007/0030096 A1* 2/2007 Nishihara .............. H03H 9/605
                                                  333/133
2016/0218695 A1  7/2016 Nosaka
2018/0115300 A1* 4/2018 Kaneko .................... H03H 9/25
(Continued)

FOREIGN PATENT DOCUMENTS

CN  102362431 A  * 2/2012 .......... H03H 9/6409
CN  103201953 A  * 7/2013 .......... H03H 9/0576
(Continued)

OTHER PUBLICATIONS

Official Communication issued in International Patent Application No. PCT/JP2020/027908, mailed on Aug. 25, 2020.

Primary Examiner — Daniel Pihulic
(74) Attorney, Agent, or Firm — Keating & Bennett, LLP

(57) ABSTRACT

An acoustic wave filter device includes first and second signal terminals, a series arm circuit connected between the first and second signal terminals and including series arm resonators, and a parallel arm circuit connected in series between the series arm circuit and a ground potential and including at least one parallel arm resonator. The series arm resonators include first and second series arm resonators having different anti-resonant frequencies from each other. The anti-resonant frequency of the first series arm resonator is lowest among anti-resonant frequencies of the plurality of series arm resonators. The first series arm resonator and the second series arm resonator are connected to each other without another circuit element interposed therebetween.

16 Claims, 6 Drawing Sheets

(56) References Cited

U.S. PATENT DOCUMENTS

| | | | | |
|---|---|---|---|---|
| 2020/0244247 A1* | 7/2020 | Maeda | ................ | H03H 9/6483 |
| 2020/0328823 A1 | 10/2020 | Nakagawa et al. | | |
| 2022/0123717 A1* | 4/2022 | Takeuchi | ............... | H03H 9/703 |
| 2022/0158623 A1* | 5/2022 | Takeuchi | ............. | H03H 9/6483 |

FOREIGN PATENT DOCUMENTS

| | | | | | |
|---|---|---|---|---|---|
| CN | 103250348 | A | * | 8/2013 | ........... H01L 41/053 |
| CN | 103201953 | B | * | 9/2015 | ........... H03H 9/0576 |
| CN | 103250348 | B | * | 9/2015 | ........... H01L 41/053 |
| CN | 107636961 | A | * | 1/2018 | ......... H01L 41/0805 |
| CN | 217183269 | U | * | 8/2022 | ............... H03H 9/13 |
| JP | 2004-343168 | A | | 12/2004 | |
| JP | 2007074698 | A | * | 3/2007 | ............. H03H 9/605 |
| JP | 2011040817 | A | * | 2/2011 | ............. H03H 9/568 |
| JP | 2016136687 | A | * | 7/2016 | ............. H03H 9/568 |
| JP | 2018067874 | A | * | 4/2018 | ......... H03H 9/02559 |
| JP | 2019138812 | A | * | 8/2019 | ............. A63B 69/36 |
| WO | WO-2019138812 | A1 | * | 7/2019 | ......... H01L 41/0472 |
| WO | WO-2021024762 | A1 | * | 2/2021 | ............... H03H 9/13 |

\* cited by examiner

ACOUSTIC WAVE FILTER DEVICE

CROSS REFERENCE TO RELATED APPLICATIONS

This application claims the benefit of priority to Japanese Patent Application No. 2019-144407 filed on Aug. 6, 2019 and is a Continuation Application of PCT Application No. PCT/JP2020/027908 filed on Jul. 17, 2020. The entire contents of each application are hereby incorporated herein by reference.

BACKGROUND OF THE INVENTION

1. Field of the Invention

The present invention relates to an acoustic wave filter device.

2. Description of the Related Art

Hitherto, an acoustic wave filter device has been widely used for a filter of a cellular phone or the like. Japanese Unexamined Patent Application Publication No. 2004-343168 discloses an example of an acoustic wave filter device. This acoustic wave filter device is a ladder filter including a plurality of series arm resonators and a plurality of parallel arm resonators. The series arm resonators and the parallel arm resonators are all surface acoustic wave resonators.

Hitherto, the ladder filter as described above is widely used especially as a transmission filter of a duplexer. In a duplexer, the ladder filter and another filter are connected to the antenna or the like so as to form a common connection. To increase the amount of attenuation in the pass band of the other filter, high steepness is required in the filter characteristics of the ladder filter. To improve steepness, for example, it is known that the fractional bandwidth of a resonator is reduced by reducing an effective electromechanical coupling coefficient of the resonator. However, with a known technology, it is difficult to obtain sufficient attenuation characteristics outside the pass band when steepness is increased.

SUMMARY OF THE INVENTION

Preferred embodiments of the present invention provide acoustic wave filter devices that are each able to improve steepness and increase the amount of attenuation outside a pass band and over a wide frequency range near the pass band.

An acoustic wave filter device according to a preferred embodiment of the present invention includes a first signal terminal, a second signal terminal, a series arm circuit connected between the first signal terminal and the second signal terminal and including a plurality of series arm resonators, and a parallel arm circuit connected in series between the series arm circuit and a ground potential and including at least one parallel arm resonator. The plurality of series arm resonators include a first series arm resonator and a second series arm resonator having different anti-resonant frequencies from each other. The anti-resonant frequency of the first series arm resonator is lowest among anti-resonant frequencies of the plurality of series arm resonators. The first series arm resonator and the second series arm resonator are connected to each other without another circuit element interposed therebetween.

An acoustic wave filter device according to a preferred embodiment of the present invention includes a first signal terminal, a second signal terminal, a series arm circuit connected between the first signal terminal and the second signal terminal and including at least one series arm resonator, and a parallel arm circuit connected in series between the series arm circuit and a ground potential and including a plurality of parallel arm resonators. The plurality of parallel arm resonators include a first parallel arm resonator and a second parallel arm resonator, the first parallel arm resonator and the second parallel arm resonator having different resonant frequencies from each other. A resonant frequency of the first parallel arm resonator is highest among resonant frequencies of the plurality of parallel arm resonators. The first parallel arm resonator and the second parallel arm resonator are connected to each other without another circuit element interposed therebetween.

With acoustic wave filter devices according to preferred embodiments of the present invention, steepness is able to be improved, and an amount of attenuation outside the pass band can be increased over a wide frequency range near the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detailed below with reference to the drawings.

Individual preferred embodiments described herein are examples, and portions of the configurations in different preferred embodiments can be substituted for one another or combined with one another.

Figure 1:
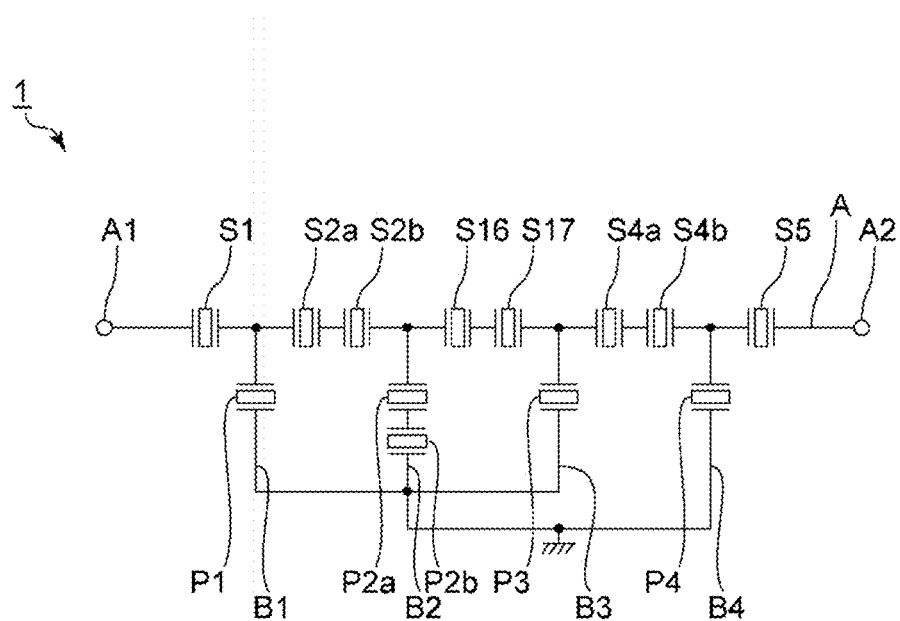
FIG. 1 is a circuit diagram of an acoustic wave filter device according to a first preferred embodiment of the present invention.

FIG. 1 is a circuit diagram of an acoustic wave filter device according to a first preferred embodiment of the present invention.

An acoustic wave filter device 1 is a ladder filter including a plurality of series arm resonators and a plurality of parallel arm resonators. More specifically, the acoustic wave filter device 1 is a band pass filter having, for example, a pass band of about 2401 MHz to about 2483 MHz. Note that the pass band of the acoustic wave filter device 1 is not limited to the above-described pass band.

The acoustic wave filter device 1 includes a series arm resonator S1, a series arm resonator S2a, a series arm resonator S2b, a first series arm resonator S16, a second series arm resonator S17, a series arm resonator S4a, a series arm resonator S4b, and a series arm resonator S5 arranged in a series arm circuit A.

The first series arm resonator S16 has the lowest anti-resonant frequency among the plurality of series arm resonators. The second series arm resonator S17 has the highest anti-resonant frequency among the plurality of series arm resonators. The first series arm resonator S16 and the second series arm resonator S17 are connected in series with each other without another circuit element interposed therebetween. In this case, examples of the other circuit element include circuit elements on the series arm circuit A and also circuit elements on parallel arm circuits that connect the series arm circuit A to a ground potential. The anti-resonant frequency of the second series arm resonator S17 does not have to be the highest among the anti-resonant frequencies of the plurality of series arm resonators. It is sufficient that the anti-resonant frequency of the first series arm resonator S16 differs from that of the second series arm resonator S17.

Note that the series arm resonator S2a and the series arm resonator S2b are serially divided series arm resonators. Similarly, the series arm resonator S4a and the series arm resonator S4b are serially divided series arm resonators. That is, the series arm resonator S2a and the series arm resonator S2b are equal or substantially equal to each other in terms of electrical characteristics. Similarly, the series arm resonator S4a and the series arm resonator S4b are equal or substantially equal to each other in terms of electrical characteristics. In contrast, the first series arm resonator S16 and the second series arm resonator S17 are not serially divided series arm resonators and are series arm resonators that are independent of each other. That is, the first series arm resonator S16 and the second series arm resonator S17 differ from each other in terms of electrical characteristics.

One end and the other end of the series arm circuit A are a first signal terminal A1 and a second signal terminal A2, which are connected to respective signal potentials. The first signal terminal A1 is an antenna terminal connected to an antenna. The acoustic wave filter device 1 according to the present preferred embodiment is a transmission filter connected to the antenna. Indeed, the acoustic wave filter device 1 does not have to be connected to an antenna and also does not have to be a transmission filter. The acoustic wave filter device 1 may be a reception filter. The first signal terminal A1 and the second signal terminal A2 may be configured as wiring lines or may be configured as pad units. Note that the series arm resonator S1 is provided closest to the first signal terminal A1 among the plurality of series arm resonators.

In a plurality of parallel arm circuits that connect the series arm circuit A to the ground potential, a plurality of parallel arm resonator are provided. More specifically, a parallel arm circuit B1 connects a node between the series arm resonator S1 and the series arm resonator S2a to the ground potential. A parallel arm circuit B2 connects a node between the series arm resonator S2b and the first series arm resonator S16 to the ground potential. A parallel arm circuit B3 connects a node between the second series arm resonator S17 and the series arm resonator S4a to the ground potential. A parallel arm circuit B4 connects a node between the series arm resonator S4b and the series arm resonator S5 to the ground potential. A parallel arm resonator P1 is arranged in the parallel arm circuit B1. A parallel arm resonator P2a and a parallel arm resonator P2b are arranged in the parallel arm circuit B2. Note that the parallel arm resonator P2a and the parallel arm resonator P2b are serially divided parallel arm resonators. A parallel arm resonator P3 is provided in the parallel arm circuit B3. A parallel arm resonator P4 is provided in the parallel arm circuit B4.

The parallel arm circuit B1, the parallel arm circuit B2, and the parallel arm circuit B3 are connected to each other on the ground potential side. Furthermore, the parallel arm circuit B1, the parallel arm circuit B2, and the parallel arm circuit B3, and the parallel arm circuit B4 are connected to the ground potential at a common connection.

In the present preferred embodiment, the first series arm resonator S16 and the second series arm resonator S17 are provided in the series arm circuit A and between portions where the parallel arm circuit B2 and the parallel arm circuit B3 are connected to the series arm circuit A. Note that the positions of the first series arm resonator S16 and the second series arm resonator S17 are not limited to the above-described positions in the series arm circuit A. The circuit configuration of the acoustic wave filter device 1 is not limited to the one described above. It is sufficient that the acoustic wave filter device 1 include the first series arm resonator S16, the second series arm resonator S17, and at least one parallel arm resonator.

Each of the series arm resonators and the parallel arm resonators of the acoustic wave filter device 1 is an acoustic wave resonator. In the following, specific configurations of the series arm resonators and the parallel arm resonators according to the present preferred embodiment will be described.

Figure 2:
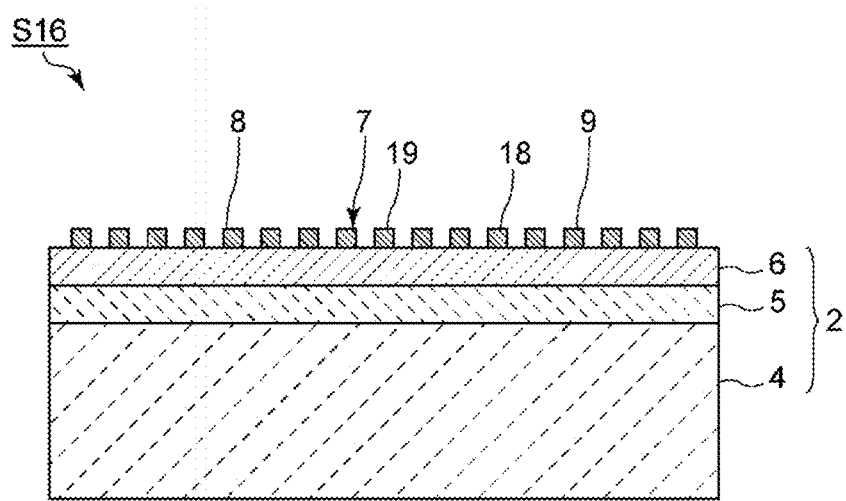
FIG. 2 is a front sectional view of a first series arm resonator in the first preferred embodiment of the present invention.

FIG. 2 is a front sectional view of the first series arm resonator in the first preferred embodiment.

The first series arm resonator S16 includes a piezoelectric substrate 2. The piezoelectric substrate 2 is a multilayer substrate in which a high-acoustic-velocity support substrate 4 defining and functioning as a high-acoustic-velocity material layer, a low-acoustic-velocity film 5, and a piezoelectric layer 6 are stacked in this order. An interdigital transducer (IDT) electrode 7 is provided on the piezoelectric layer 6 of the piezoelectric substrate 2. Note that the piezoelectric substrate 2 may be a piezoelectric substrate including only the piezoelectric layer 6.

An acoustic wave is excited by applying an alternating voltage to the IDT electrode 7. On the piezoelectric substrate 2, a reflector 8 and a reflector 9 are provided on both sides of an acoustic wave propagation direction of the IDT electrode 7, the reflector 8 and the reflector 9 making a pair.

As a material of the piezoelectric layer 6, for example, lithium tantalate, lithium niobate, zinc oxide, aluminum nitride, quartz, or PZT can be used.

The low-acoustic-velocity film 5 is a relatively low-acoustic-velocity film. More specifically, the acoustic velocity of a bulk wave propagating through the low-acoustic-velocity film 5 is lower than that of a bulk wave propagating through the piezoelectric layer 6. In the present preferred embodiment, the low-acoustic-velocity film 5 is, for example, an oxidized silicon film. Oxidized silicon can be expressed by $SiO_x$. In the present preferred embodiment, the low-acoustic-velocity film 5 is, for example, a $SiO_2$ film. Note that the material of the low-acoustic-velocity film 5 is not limited to the one described above. For example, glass, silicon oxynitride, tantalum oxide, or a material having, as the main ingredient, a compound obtained by adding fluorine, carbon, or boron to oxidized silicon can also be used.

A high-acoustic-velocity material layer is a relatively high-acoustic-velocity layer. More specifically, the acoustic velocity of a bulk wave propagating through a high-acoustic-velocity material layer is higher than that of an acoustic wave propagating through the piezoelectric layer 6. In the present preferred embodiment, the high-acoustic-velocity material layer is the high-acoustic-velocity support substrate 4. In the present preferred embodiment, the high-acoustic-velocity support substrate 4 is, for example, a silicon substrate. The material of the high-acoustic-velocity support substrate 4 is not limited to the one described above. For example, a medium including, as the main ingredient, a material such as aluminum oxide, silicon carbide, silicon nitride, silicon oxynitride, sapphire, lithium tantalate, lithium niobate, quartz, alumina, zirconia, cordierite, mullite, steatite, forsterite, magnesia, a diamond-like carbon (DLC) film, or diamond can also be used.

The acoustic wave filter device 1 according to the present preferred embodiment has a multilayer structure including the high-acoustic-velocity support substrate 4, the low-acoustic-velocity film 5, and the piezoelectric layer 6 that are stacked in this order, and thus the energy of an acoustic wave can be effectively trapped on the piezoelectric layer 6 side.

Figure 3:
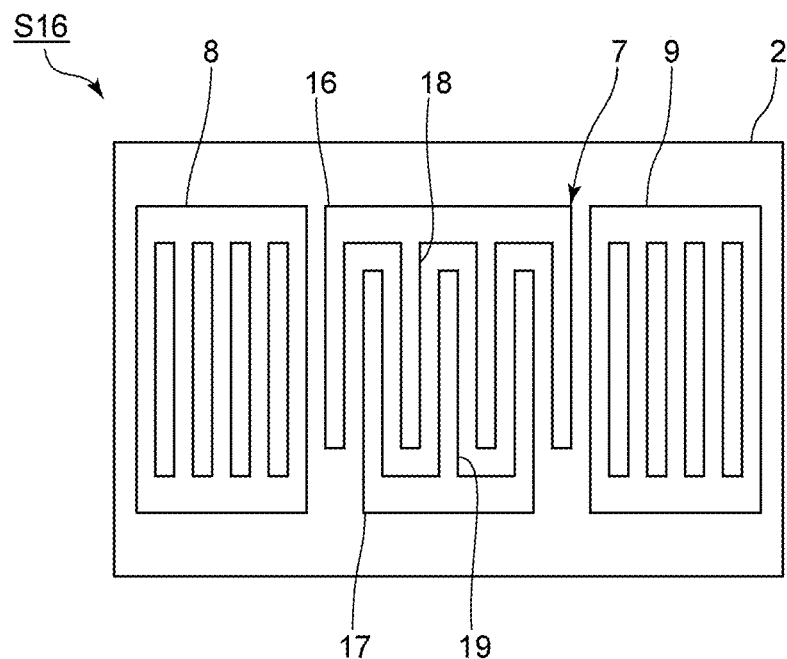
FIG. 3 is a plan view of the first series arm resonator in the first preferred embodiment of the present invention.

FIG. 3 is a plan view of the first series arm resonator in the first preferred embodiment. Note that, for example, wiring lines connected to the first series arm resonator are omitted in FIG. 3.

The IDT electrode 7 includes a first busbar 16 and a second busbar 17, which face each other, a plurality of first electrode fingers 18, and a plurality of second electrode fingers 19. One end of each of the plurality of first electrode fingers 18 is connected to the first busbar 16. One end of each of the plurality of second electrode fingers 19 is connected to the second busbar 17. The plurality of first electrode fingers 18 and the plurality of second electrode fingers 19 are interdigitated with each other. The IDT electrode 7, the reflector 8, and the reflector 9 may be defined by a multilayer metal film in which a plurality of metal layers are stacked or may be defined by a single-layer metal film.

The plurality of series arm resonators other than the first series arm resonator S16 and the plurality of parallel arm resonators are configured similarly to the first series arm resonator S16. The plurality of series arm resonators and the plurality of parallel arm resonators in the present preferred embodiment are, for example, surface acoustic wave (SAW) devices. Note that design parameters for the plurality of series arm resonators and the plurality of parallel arm resonators can be varied in accordance with desired characteristics.

In the present preferred embodiment, the anti-resonant frequency of the first series arm resonator S16 is the lowest among the anti-resonant frequencies of the plurality of series arm resonators and the first series arm resonator S16 and the second series arm resonator S17 are connected to each other without a circuit element interposed therebetween. As a result, steepness can be improved, and the amount of attenuation outside the pass band can be increased over a wide frequency range near the pass band. Note that "steepness" refers to the magnitude of a change in insertion loss with respect to a change in frequency at, for example, a high-frequency side end portion or a low-frequency side end portion with respect to the pass band. Herein, "near the pass band" refers to a range corresponding to about 10% from the high-frequency end or the low-frequency end of the pass band. Details of the advantages descried above will be described in the following.

Attenuation-frequency characteristics of the acoustic wave filter device according to the first preferred embodiment are compared with those of an acoustic wave filter device according to a comparative example. Note that the comparative example differs from the first preferred embodiment in that the acoustic wave filter device according to the comparative example does not include the second series arm resonator and that the first series arm resonator is serially divided.

Figure 4:
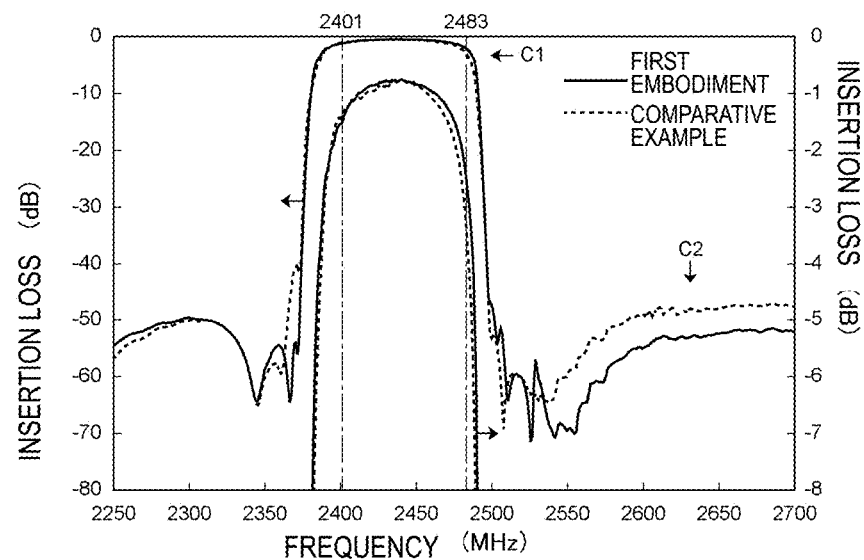
FIG. 4 is a diagram illustrating attenuation-frequency characteristics of the acoustic wave filter device according to the first preferred embodiment of the present invention and those of an acoustic wave filter device according to a comparative example.

FIG. 4 is a diagram illustrating the attenuation-frequency characteristics of the acoustic wave filter device according to the first preferred embodiment and those of the comparative example. In FIG. 4, a solid line represents a result of the first preferred embodiment, and a broken line represents a result of the comparative example. Dot-and-dash lines in FIG. 4 represent the low-frequency end and the high-frequency end of the pass band.

As indicated by an arrow C1 in FIG. 4, it is clear that when compared with the comparative example, steepness on the high-frequency side of the pass band is improved in the first preferred embodiment. Furthermore, as indicated by an arrow C2, it is clear that the amount of attenuation of the first preferred embodiment is greater than that of the comparative example over a wide frequency range on the high-frequency side of and near the pass band. The reason why such advantageous effects can be obtained will be described in the following.

Figure 5:
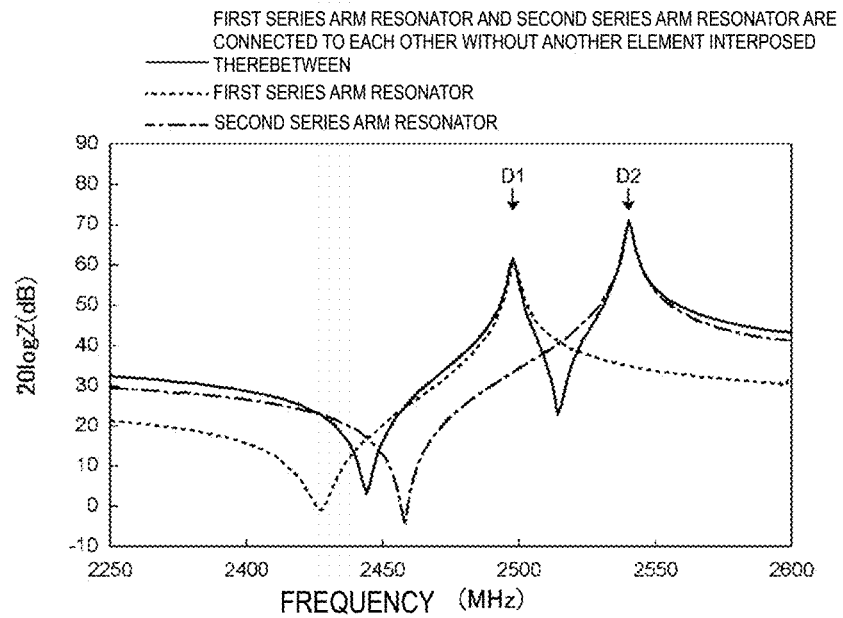
FIG. 5 is a diagram illustrating impedance characteristics of the first series arm resonator and a second series arm resonator according to the first preferred embodiment of the present invention.

FIG. 5 is a diagram illustrating impedance characteristics of the first series arm resonator and the second series arm resonator in the first preferred embodiment. In FIG. 5, a solid line represents a result for a case where the first series arm resonator S16 and the second series arm resonator S17 are connected to each other without another circuit element interposed therebetween. A broken line represents a result of the first series arm resonator S16 alone. A dot-and-dash line represents a result of the second series arm resonator alone.

As represented by the solid line in FIG. 5, in a case where the first series arm resonator S16 and the second series arm resonator S17 are connected to each other without another circuit element interposed therebetween, the resonant frequency is higher than that of the first series arm resonator S16 alone and lower than that of the second series arm resonator S17 alone. This is because in a case where the second series arm resonator S17 is connected directly to and in series with the first series arm resonator S16, the second series arm resonator S17 defines and functions as a capacitor connected in series with the first series arm resonator S16 when viewed from the first series arm resonator S16. As a result, the fractional bandwidth of the first series arm resonator S16 decreases. Thus, the resonant frequency for the case where the second series arm resonator S17 is connected directly to and in series with the first series arm resonator S16 is higher than that of the first series arm resonator S16 alone. The first series arm resonator S16 corresponds to the pass band of the acoustic wave filter device 1, and the anti-resonant frequency of the first series arm resonator S16 is the lowest among the anti-resonant frequencies of the plurality of series arm resonators. Thus, the anti-resonant frequency of the first series arm resonator S16 is located near the high-frequency end of the pass band. By reducing the fractional bandwidth of such a resonator, the steepness near the high-frequency end of the pass band can be improved.

Furthermore, in a case where the first series arm resonator S16 and the second series arm resonator S17 are connected in series with each other without another circuit element interposed therebetween, it is clear that the anti-resonance point splits and that a first anti-resonance point indicated by an arrow D1 and a second anti-resonance point indicated by an arrow D2 occur in FIG. 5. The frequency of the first anti-resonance point is equal or substantially equal to the anti-resonant frequency of the first series arm resonator S16 alone. The frequency of the second anti-resonance point is equal or substantially equal to the anti-resonant frequency of the second series arm resonator S17 alone. In this manner, the anti-resonance point splits, and the second anti-resonance point occurs, which is on the high-frequency side of and apart from the pass band. An attenuation pole occurs due to the second anti-resonance point, and thus the amount of attenuation can be increased over a wide frequency range on the high-frequency side of and near the pass band.

As in the present preferred embodiment, it is preferable that the anti-resonant frequency of the second series arm resonator S17 is the highest among the anti-resonant frequencies of the plurality of series arm resonators. Consequently, the difference between the anti-resonant frequency of the first series arm resonator S16 and the anti-resonant frequency of the second series arm resonator S17 can be effectively increased. As a result, an attenuation pole can be caused to occur at a frequency further apart from the pass band. Thus, the amount of attenuation can be increased with more certainty over a wide frequency range on the high-frequency side of and near the pass band.

Figure 6:
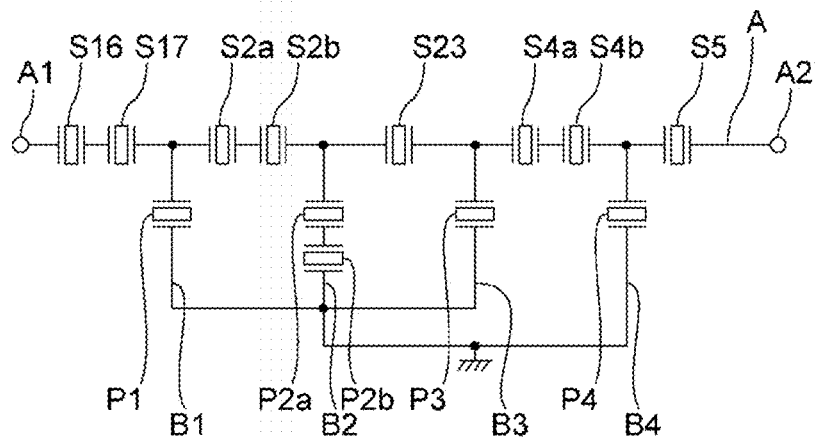
FIG. 6 is a circuit diagram of an acoustic wave filter device according to a first modification of the first preferred embodiment of the present invention.

As described above, the positions of the first series arm resonator S16 and the second series arm resonator S17 are not limited to those illustrated in FIG. 1. For example, in a first modification of the first preferred embodiment illustrated in FIG. 6, the first series arm resonator S16 is the series arm resonator closest to the antenna, namely the first signal terminal A1, among the plurality of series arm resonators. The first series arm resonator S16 and the second series arm resonator S17 are between the first signal terminal A1 and a portion where the series arm circuit A and the parallel arm circuit B1 are connected to each other. A series arm resonator S23 is in the series arm circuit A and between portions where the parallel arm circuit B2 and the parallel arm circuit B3 are connected to the series arm circuit A. Even in this case, similar to the first preferred embodiment, steepness can be improved, and the amount of attenuation outside the pass band can be increased over a wide frequency range near the pass band. The second series arm resonator S17 may be the series arm resonator closest to the first signal terminal A1 among the plurality of series arm resonators.

The acoustic wave filter device 1 according to the first preferred embodiment is, for example, a ladder filter. An acoustic wave filter device according to a preferred embodiment of the present invention may be, for example, a duplexer or a multiplexer that includes a ladder filter according to the first preferred embodiment and a filter device that defines a common connection with, for example, the ladder filter and the antenna. In this case, the amount of attenuation outside the pass band of the ladder filter described above can be increased, and thus an effect on the filter characteristic of the above-described filter device can be reduced.

As described above, the piezoelectric layer 6 is provided indirectly on the high-acoustic-velocity support substrate 4 with the low-acoustic-velocity film 5 interposed therebetween in the piezoelectric substrate 2 of the first preferred embodiment. The configuration of the piezoelectric substrate 2 is not limited to the one described above. In the following, second to fourth modifications of the first preferred embodiment will be described in which only the configurations of piezoelectric substrates differ from the configuration of the piezoelectric substrate of the first preferred embodiment. Even in the second to fourth modifications, similar to the first preferred embodiment, steepness can be improved, and the amount of attenuation outside the pass band can be increased over a wide frequency range near the pass band. In addition, the energy of an acoustic wave can be effectively trapped on the piezoelectric layer side.

Figure 7:
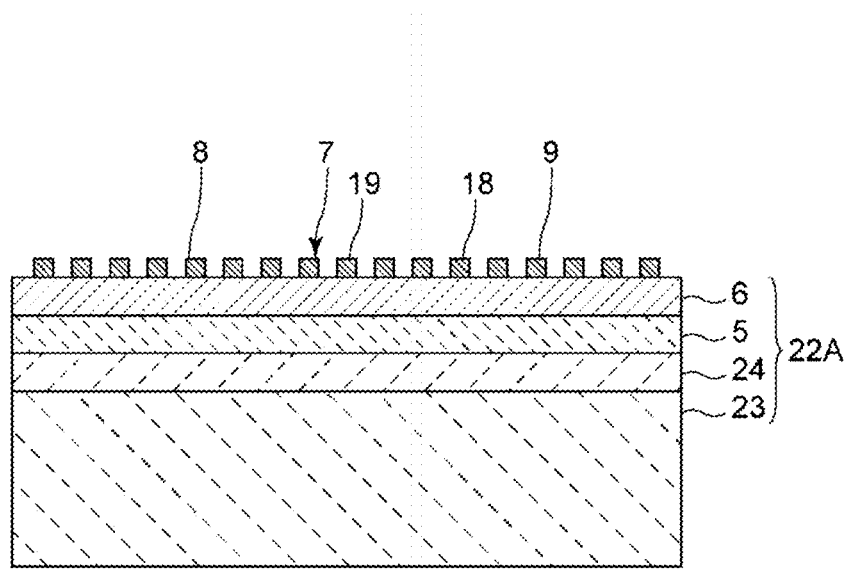
FIG. 7 is a front sectional view of a first series arm resonator in a second modification of the first preferred embodiment of the present invention.

A high-acoustic-velocity material layer in the second modification illustrated in FIG. 7 is a high-acoustic-velocity film 24. A piezoelectric substrate 22A includes a support substrate 23, the high-acoustic-velocity film 24 provided on the support substrate 23, the low-acoustic-velocity film 5 provided on the high-acoustic-velocity film 24, and the piezoelectric layer 6 provided on the low-acoustic-velocity film 5. In a case where the piezoelectric substrate 22A includes the high-acoustic-velocity film 24, a relatively high-acoustic-velocity material does not have to be used in the support substrate 23.

As a material of the support substrate 23, for example, a piezoelectric material such as aluminum oxide, lithium tantalate, lithium niobate, or quartz, various types of ceramic such as alumina, magnesia, silicon nitride, aluminum nitride, silicon carbide, zirconia, cordierite, mullite, steatite, or forsterite, a dielectric such as sapphire, diamond, or glass, a semiconductor such as silicon or gallium nitride, or a resin can be used.

As a material of the high-acoustic-velocity film 24, for example, a medium having, as the main ingredient, a material such as aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a DLC film, or diamond can be used.

Figure 8:
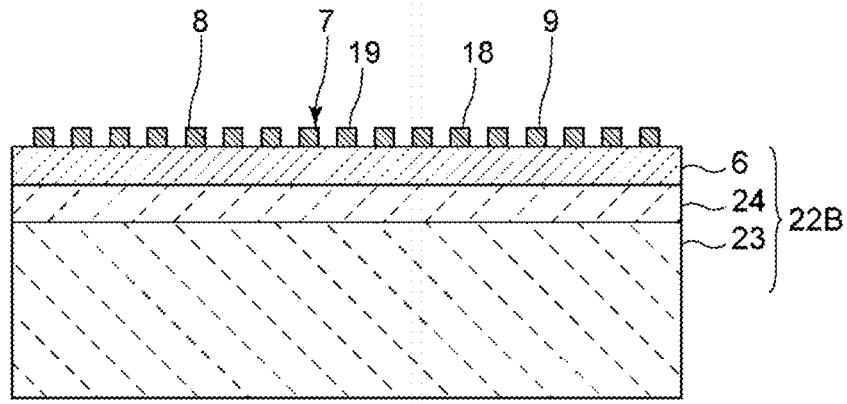
FIG. 8 is a front sectional view of a first series arm resonator in a third modification of the first preferred embodiment of the present invention.

In the third modification illustrated in FIG. 8, a piezoelectric substrate 22B includes the support substrate 23, the high-acoustic-velocity film 24 provided on the support substrate 23, and the piezoelectric layer 6 provided on the high-acoustic-velocity film 24.

Figure 9:
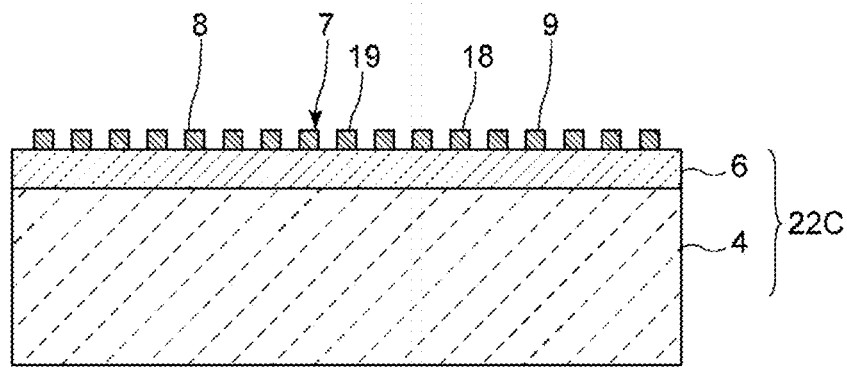
FIG. 9 is a front sectional view of a first series arm resonator in a fourth modification of the first preferred embodiment of the present invention.

In the fourth modification illustrated in FIG. 9, a piezoelectric substrate 22C includes the high-acoustic-velocity support substrate 4 and the piezoelectric layer 6 provided directly on the high-acoustic-velocity support substrate 4.

Figure 10:
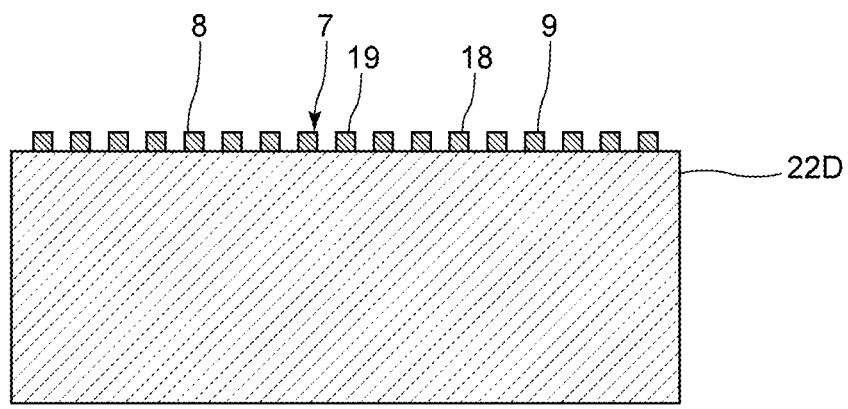
FIG. 10 is a front sectional view of a first series arm resonator in a fifth modification of the first preferred embodiment of the present invention.

In contrast, in the fifth modification illustrated in FIG. 10, a piezoelectric substrate 22D includes only a piezoelectric layer. Even in the present modification, similar to the first preferred embodiment, steepness can be improved, and the amount of attenuation outside the pass band can be increased over a wide frequency range near the pass band.

Figure 11:
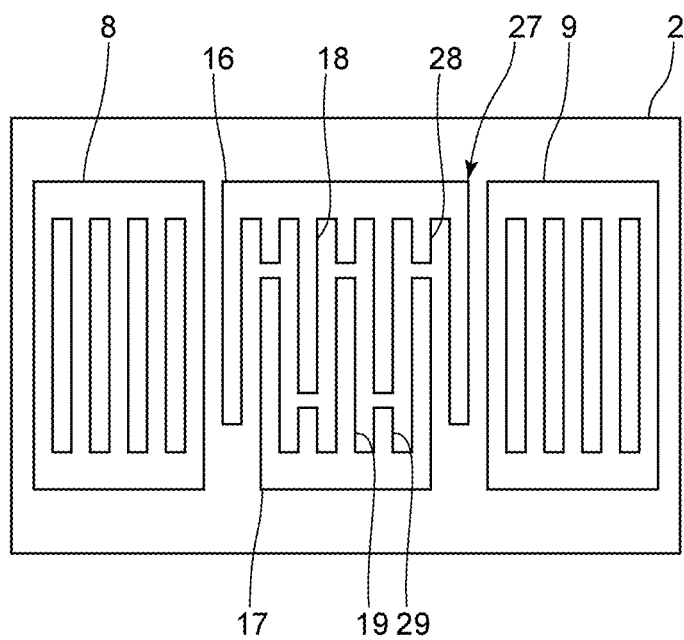
FIG. 11 is a plan view of a first series arm resonator in a sixth modification of the first preferred embodiment of the present invention.

FIG. 11 is a plan view of a first series arm resonator in a sixth modification of the first preferred embodiment.

An IDT electrode 27 includes the first busbar 16, the second busbar 17, the plurality of first electrode fingers 18, and the plurality of second electrode fingers 19, similar to the first preferred embodiment. Furthermore, the IDT electrode 27 in the present modification includes a plurality of first dummy electrode fingers 28 and a plurality of second dummy electrode fingers 29. One end of each of the plurality of first dummy electrode fingers 28 is connected to the first busbar 16. The other ends of the plurality of first dummy electrode fingers 28 face the plurality of second electrode fingers 19 across a gap. One end of each of the plurality of second dummy electrode fingers 29 is connected to the second busbar 17. The other ends of the plurality of second dummy electrode fingers 29 face the plurality of first electrode fingers 18 across a gap. Even in the present modification, similar to the first preferred embodiment, steepness can be improved, and the amount of attenuation outside the pass band can be increased over a wide frequency range near the pass band.

In this case, a wavelength defined by the pitch of the electrode fingers of the IDT electrode is denoted by $\lambda$. The pitch of the electrode fingers is an electrode-finger center-center distance between adjacent first electrode fingers or adjacent second electrode fingers. In the sixth modification illustrated in FIG. 11, it is preferable that the lengths of the first dummy electrode fingers 28 are, for example, greater than or equal to about $1.3\lambda$ and less than or equal to about $2\lambda$ in the direction in which the first dummy electrode fingers 28 extend. Similarly, it is preferable that the lengths of the second dummy electrode fingers 29 are, for example, greater than or equal to about $1.3\lambda$ and less than or equal to about $2\lambda$ in the direction in which the second dummy electrode fingers 29 extend. Therefore, surface skimming bulk waves (SSBWs) that leak in an intersecting width direction of the resonator can be reduced, and the steepness near the high-frequency end of the pass band of the filter can be effectively improved. The intersecting width direction of the resonator is a direction orthogonal or substantially orthogonal to a direction in which an acoustic wave propagates.

Figure 12:
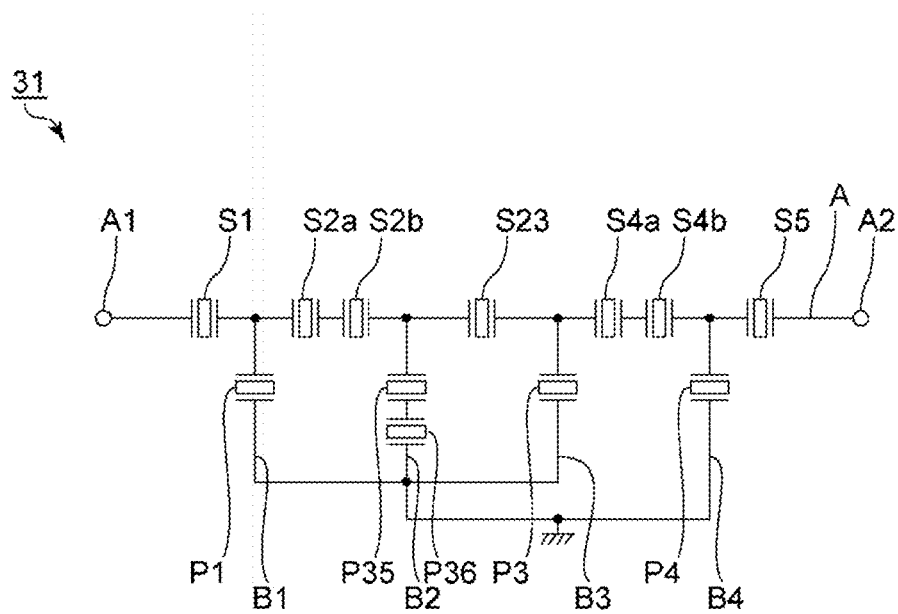
FIG. 12 is a circuit diagram of an acoustic wave filter device according to a second preferred embodiment of the present invention.

FIG. 12 is a circuit diagram of an acoustic wave filter device according to a second preferred embodiment of the present invention.

An acoustic wave filter device 31 according to the present preferred embodiment includes the series arm resonator S1, the series arm resonator S2a, the series arm resonator S2b, the series arm resonator S23, the series arm resonator S4a, the series arm resonator S4b, and the series arm resonator S5 arranged in the series arm circuit A.

Similar to the first preferred embodiment, a plurality of parallel arm resonators are provided in a plurality of parallel arm circuits that connect the series arm circuit A to the ground potential. The parallel arm resonator P1 is provided in the parallel arm circuit B1. In the parallel arm circuit B2, a first parallel arm resonator P35 and a second parallel arm resonator P36 are provided. The parallel arm resonator P3 is provided in the parallel arm circuit B3. The parallel arm resonator P4 is provided in the parallel arm circuit B4.

The first parallel arm resonator P35 and the second parallel arm resonator P36 are not serially divided parallel arm resonators and are parallel arm resonators that are independent of each other. The resonant frequency of the first parallel arm resonator P35 is the highest among the resonant frequencies of the plurality of parallel arm resonators. The resonant frequency of the second parallel arm resonator P36 is the lowest among the resonant frequencies of the plurality of parallel arm resonators. The first parallel arm resonator P35 and the second parallel arm resonator P36 are connected in series with each other without another circuit element interposed therebetween. The resonant frequency of the second parallel arm resonator P36 does not have to be the lowest among the resonant frequencies of the plurality of parallel arm resonators. It is sufficient that the resonant frequency of the first parallel arm resonator P35 differs from that of the second parallel arm resonator P36.

In the present preferred embodiment, the first parallel arm resonator P35 and the second parallel arm resonator P36 are provided in the parallel arm circuit B2 other than the parallel arm circuit B1, which is the closest to an antenna terminal, namely the first signal terminal A1. It is sufficient that the first parallel arm resonator P35 and the second parallel arm resonator P36 are connected to each other without another circuit element interposed therebetween, and the arrangement of the first parallel arm resonator P35 and the second parallel arm resonator P36 is not specifically limited. For example, the first parallel arm resonator P35 and the second parallel arm resonator P36 may be arranged in the parallel arm circuit B1, which is the closest to the first signal terminal A1. Alternatively, the acoustic wave filter device may include a parallel arm circuit connected between the first signal terminal A1 and the series arm resonator S1 closest to the first signal terminal A1 among the plurality of series arm resonators in the series arm circuit A. In the parallel arm circuit, the first parallel arm resonator P35 and the second parallel arm resonator P36 may be provided.

As in the present preferred embodiment, in a case where the second parallel arm resonator P36 is connected directly to and in series with the first parallel arm resonator P35, the second parallel arm resonator P36 defines and functions as a capacitor connected in series with the first parallel arm resonator P35 when viewed from the first parallel arm resonator P35. As a result, the fractional bandwidth of the first parallel arm resonator P35 decreases. The first parallel arm resonator P35 corresponds to the pass band of the acoustic wave filter device 31, and the resonant frequency of the first parallel arm resonator P35 is the highest among the resonant frequencies of the plurality of parallel arm resonators. Thus, the resonant frequency of the first parallel arm resonator P35 is located near the low-frequency end of the pass band. By reducing the fractional bandwidth of such a resonator, the steepness near the low-frequency end of the pass band can be improved.

Furthermore, in a case where the first parallel arm resonator P35 and the second parallel arm resonator P36 are connected in series with each other without another circuit element interposed therebetween, a resonance point splits, and a first resonance point and a second resonance point occur. The frequency of the first resonance point is equal or substantially equal to the resonant frequency of the first parallel arm resonator P35 alone. The frequency of the second resonance point is equal or substantially equal to the resonant frequency of the second parallel arm resonator P36 alone. In this manner, the resonance point splits, and the second resonance point occurs, which is on the low-frequency side of and apart from the pass band. An attenuation pole occurs due to this second resonance point, and thus the amount of attenuation can be increased over a wide frequency range on the low-frequency side of and near the pass band.

As in the present preferred embodiment, it is preferable that the resonant frequency of the second parallel arm resonator P36 is the lowest among the resonant frequencies of the plurality of series arm resonators. Consequently, the difference between the resonant frequency of the first parallel arm resonator P35 and the resonant frequency of the second parallel arm resonator P36 can be effectively increased. As a result, an attenuation pole can be caused to occur at a frequency further apart from the pass band. Thus, the amount of attenuation can be increased with more certainty over a wide frequency range on the low-frequency side of and near the pass band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   a first signal terminal;
   a second signal terminal;
   a series arm circuit connected between the first signal terminal and the second signal terminal and including a plurality of series arm resonators; and
   a parallel arm circuit connected in series between the series arm circuit and a ground potential and including at least one parallel arm resonator; wherein
   the plurality of series arm resonators include a first series arm resonator and a second series arm resonator having different anti-resonant frequencies from each other;
   the anti-resonant frequency of the first series arm resonator is lowest among anti-resonant frequencies of the plurality of series arm resonators; and
   the first series arm resonator and the second series arm resonator are connected to each other without another circuit element interposed therebetween.

2. The acoustic wave filter device according to claim 1, wherein the anti-resonant frequency of the second series arm resonator is highest among the anti-resonant frequencies of the plurality of series arm resonators.

3. The acoustic wave filter device according to claim 1, further comprising:
   a plurality of the parallel arm circuits; wherein
   the at least one parallel arm resonator is in each of the plurality of parallel arm circuits; and
   the first series arm resonator and the second series arm resonator are in the series arm circuit and between portions where two of the plurality of parallel arm circuits are connected to the series arm circuit.

4. The acoustic wave filter device according to claim 1, wherein
   the acoustic wave filter device is connected to an antenna; and
   a series arm resonator closest to the antenna among the plurality of series arm resonators is one of the first series arm resonator and the second series arm resonator.

5. An acoustic wave filter device comprising:
   a first signal terminal;
   a second signal terminal;
   a series arm circuit connected between the first signal terminal and the second signal terminal and including at least one series arm resonator; and
   a parallel arm circuit connected in series between the series arm circuit and a ground potential and including a plurality of parallel arm resonators; wherein
   the plurality of parallel arm resonators include a first parallel arm resonator and a second parallel arm resonator, the first parallel arm resonator and the second parallel arm resonator having different resonant frequencies from each other;
   a resonant frequency of the first parallel arm resonator is highest among resonant frequencies of the plurality of parallel arm resonators; and
   the first parallel arm resonator and the second parallel arm resonator are connected to each other without another circuit element interposed therebetween.

6. The acoustic wave filter device according to claim 5, wherein a resonant frequency of the second parallel arm resonator is lowest among the resonant frequencies of the plurality of parallel arm resonators.

7. The acoustic wave filter device according to claim 1, wherein
   the series arm resonator and the parallel arm resonator each include a piezoelectric substrate;
   the piezoelectric substrate includes a high-acoustic-velocity material layer and a piezoelectric layer directly or indirectly on the high-acoustic-velocity material layer; and
   an acoustic velocity of a bulk wave propagating through the high-acoustic-velocity material layer is higher than an acoustic velocity of an acoustic wave propagating through the piezoelectric layer.

8. The acoustic wave filter device according to claim 7, wherein
   the piezoelectric substrate includes a low-acoustic-velocity film between the high-acoustic-velocity material layer and the piezoelectric layer; and
   an acoustic velocity of a bulk wave propagating through the low-acoustic-velocity film is lower than an acoustic velocity of a bulk wave propagating through the piezoelectric layer.

9. The acoustic wave filter device according to claim 7, wherein the high-acoustic-velocity material layer is a high-acoustic-velocity support substrate.

10. The acoustic wave filter device according to claim 7, wherein
    the piezoelectric substrate includes a support substrate; and
    the high-acoustic-velocity material layer is a high-acoustic-velocity film on the support substrate.

11. The acoustic wave filter device according to claim 1, wherein
    the series arm resonator and the parallel arm resonator each include a piezoelectric substrate; and
    the piezoelectric substrate includes only a piezoelectric layer.

12. The acoustic wave filter device according to claim 5, wherein
    the series arm resonator and the parallel arm resonator each include a piezoelectric substrate;
    the piezoelectric substrate includes a high-acoustic-velocity material layer and a piezoelectric layer directly or indirectly on the high-acoustic-velocity material layer; and
    an acoustic velocity of a bulk wave propagating through the high-acoustic-velocity material layer is higher than an acoustic velocity of an acoustic wave propagating through the piezoelectric layer.

13. The acoustic wave filter device according to claim 12, wherein the piezoelectric substrate includes a low-acoustic-velocity film between the high-acoustic-velocity material layer and the piezoelectric layer; and an acoustic velocity of a bulk wave propagating through the low-acoustic-velocity film is lower than an acoustic velocity of a bulk wave propagating through the piezoelectric layer.

14. The acoustic wave filter device according to claim 12, wherein the high-acoustic-velocity material layer is a high-acoustic-velocity support substrate.

15. The acoustic wave filter device according to claim 12, wherein the piezoelectric substrate includes a support substrate; and the high-acoustic-velocity material layer is a high-acoustic-velocity film on the support substrate.

16. The acoustic wave filter device according to claim 5, wherein the series arm resonator and the parallel arm resonator each include a piezoelectric substrate; and the piezoelectric substrate includes only a piezoelectric layer.

\* \* \* \* \*